(12) United States Patent
Mishima et al.

(10) Patent No.: US 10,381,589 B2
(45) Date of Patent: Aug. 13, 2019

(54) ORGANIC EL ELEMENT AND ORGANIC EL DISPLAY PANEL

(71) Applicant: JOLED INC., Tokyo (JP)

(72) Inventors: Kosuke Mishima, Tokyo (JP); Junko Tanaka, Tokyo (JP); Hiroshi Katagiri, Tokyo (JP); Takahiro Komatsu, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 15/220,852

(22) Filed: Jul. 27, 2016

(65) Prior Publication Data

US 2017/0033308 A1    Feb. 2, 2017

(30) Foreign Application Priority Data

Jul. 28, 2015   (JP) ................. 2015-148506

(51) Int. Cl.
*H01L 51/50*   (2006.01)
*H01L 51/52*   (2006.01)

(52) U.S. Cl.
CPC ...... *H01L 51/5092* (2013.01); *H01L 51/5004* (2013.01); *H01L 51/5076* (2013.01); *H01L 51/5218* (2013.01); *H01L 51/5234* (2013.01); *H01L 2251/552* (2013.01); *H01L 2251/558* (2013.01)

(58) Field of Classification Search
CPC ............ H01L 51/5004; H01L 51/5092; H01L 51/0072; H01L 2251/552; H01L 51/0058; H01L 51/5088; H01L 51/5278; H01L 51/5072; H01L 51/5218; H01L 51/5234; H01L 2251/5338; H01L 2251/2251
USPC ........ 257/40, E51.018, E27.119; 438/34, 46, 438/99; 313/504, 506
See application file for complete search history.

(56) References Cited

U.S. PATENT DOCUMENTS

| | | | |
|---|---|---|---|
| 7,244,887 B2 * | 7/2007 | Miley ............... | G21B 3/00 136/203 |
| 2006/0029828 A1 | 2/2006 | Kanno et al. | |
| 2006/0240279 A1* | 10/2006 | Adamovich ....... | H01L 51/5016 428/690 |
| 2006/0280967 A1 | 12/2006 | Tada | |
| 2006/0289882 A1 | 12/2006 | Nishimura et al. | |
| 2007/0296334 A1 | 12/2007 | Matsuda | |
| 2008/0006821 A1 | 1/2008 | Suzuki et al. | |

(Continued)

FOREIGN PATENT DOCUMENTS

| | | |
|---|---|---|
| JP | 2004-273163 | 9/2004 |
| JP | 2006-066872 | 3/2006 |

(Continued)

*Primary Examiner* — Nduka E Ojeh
(74) *Attorney, Agent, or Firm* — Greenblum & Bernstein, P.L.C.

(57) ABSTRACT

An organic electroluminescence (EL) element including an anode, a light-emitting layer above the anode, a first functional layer on and in contact with the light-emitting layer, a second functional layer on and in contact with the first functional layer, and a cathode above the second functional layer. A lowest unoccupied molecular orbital (LUMO) level of the first functional layer is lower than at least one of a LUMO level of the second functional layer and a Fermi level of a metal material included in the second functional layer.

28 Claims, 8 Drawing Sheets

(56) References Cited

U.S. PATENT DOCUMENTS

| | | | |
|---|---|---|---|
| 2008/0203406 A1* | 8/2008 | He | H01L 51/0062 257/94 |
| 2009/0128012 A1* | 5/2009 | Song | H01L 51/0092 313/504 |
| 2009/0212688 A1* | 8/2009 | Song | H01L 51/508 313/504 |
| 2010/0224856 A1* | 9/2010 | Iizumi | B82Y 20/00 257/13 |
| 2011/0057176 A1 | 3/2011 | Kang et al. | |
| 2012/0074398 A1* | 3/2012 | Fujita | H01L 51/5225 257/40 |
| 2013/0207082 A1* | 8/2013 | Cho | H01L 51/5016 257/40 |
| 2013/0214258 A1* | 8/2013 | Mizuki | H01L 51/0072 257/40 |
| 2014/0070196 A1* | 3/2014 | Kim | H01L 51/504 257/40 |
| 2014/0167003 A1* | 6/2014 | Kato | H01L 51/0059 257/40 |
| 2015/0144897 A1* | 5/2015 | Kang | H01L 51/5076 257/40 |
| 2015/0194635 A1* | 7/2015 | Joo | H01L 51/5268 257/40 |
| 2016/0104854 A1* | 4/2016 | Jeon | H01L 51/508 257/40 |
| 2016/0254330 A1* | 9/2016 | Uchida | H01L 51/5068 257/40 |

FOREIGN PATENT DOCUMENTS

| | | |
|---|---|---|
| JP | 2006-210845 | 8/2006 |
| JP | 2008-028371 | 2/2008 |
| JP | 2008-078414 | 4/2008 |
| JP | 2009-182288 | 8/2009 |
| JP | 2011-510450 | 3/2011 |
| JP | 2011-511458 | 4/2011 |
| JP | 2013-012554 | 1/2013 |
| JP | 2013-514665 | 4/2013 |
| JP | 2013-229411 | 11/2013 |
| JP | 2014-120590 | 6/2014 |
| JP | 2015-111584 | 6/2015 |
| WO | 2009/097108 | 8/2009 |
| WO | 2011/075359 | 6/2011 |

* cited by examiner

ORGANIC EL ELEMENT AND ORGANIC EL DISPLAY PANEL

This application is based on an application No. 2015-148506 filed in Japan, the contents of which are hereby incorporated by reference.

BACKGROUND OF THE DISCLOSURE (1) Technical Field

The present disclosure relates to energy band structure of organic materials in organic electroluminescence (EL) elements.

(2) Description of Related Art

In recent years, display devices in which a plurality of organic EL elements are arrayed on a surface of a substrate have become popular.

An organic EL element has a structure in which at least a light-emitting layer is sandwiched between an anode and a cathode.

Typically, the difference between an energy level of the lowest unoccupied molecular orbital (LUMO) of an organic material in a light-emitting layer (hereinafter, "LUMO level") and a Fermi level of a cathode material is large. Thus, the organic EL element has a configuration in which a functional layer (electron injection layer, electron transport layer, etc.) for supplying electrons to the light-emitting layer is between the light-emitting layer and the cathode. In particular, it is well-known that when a functional layer is used that includes a metal material that has a Fermi level close to the LUMO level of the light-emitting layer, favorable electron injectability can be achieved. As such a metal material, an alkali metal or an alkaline earth metal can be used (JP 2013-514665).

A functional layer that includes an alkali metal or an alkaline earth metal can, for example, be formed by co-evaporation of metal material and organic material, thereby doping the organic material with the metal material.

However, in a thin film formed by co-evaporation, it is difficult to equalize doping concentration of the metal material with high precision across the organic EL elements arrayed on the surface of the substrate. Because differences in doping concentration of the metal material causes differences in injectability of electrons in the functional layer, this effects current efficiency, lifespan, etc., of the organic EL elements. Therefore, when metal material doping concentration in the functional layer is not uniform across the organic EL elements arrayed on the surface of the substrate, a problem arises in that properties vary between the organic EL elements.

SUMMARY OF THE DISCLOSURE

The present invention is achieved in view of the above, and aims to provide an organic EL element that suppresses variation in properties while having a functional layer containing an alkali metal or alkaline earth metal.

In order to achieve this aim, one aspect of the present disclosure is an organic EL element comprising: an anode; a light-emitting layer disposed above the anode; a first functional layer disposed on and in contact with the light-emitting layer; a second functional layer disposed on and in contact with the first functional layer; and a cathode disposed above the second functional layer. A lowest unoccupied molecular orbital (LUMO) level of the first functional layer is lower than at least one of a LUMO level of the second functional layer and a Fermi level of a metal material included in the second functional layer.

When comparing LUMO levels and Fermi levels, "low" means a difference from electron vacuum level is large, and "high" means a difference from electron vacuum level is small.

The organic EL element pertaining to the above aspect has a negative value for the energy barrier to injection of electrons from the second functional layer to the first functional layer (hereinafter, "electron injection barrier"). Thus, even if doping concentration of the metal material in the second functional layer varies, it is unlikely that the electron injection barrier from the second functional layer to the first functional layer would become larger than the electron injection barrier from the first functional layer to the light-emitting layer. As a result, size of the electron injection barrier from the first functional layer to the light-emitting layer is the dominant influence on properties such as current efficiency, voltage, and lifespan of the organic EL element.

Because size of the electron injection barrier from the first functional layer to the light-emitting layer does not change even when doping concentration of the metal material in the second functional layer varies, current efficiency, lifespan, etc., are stable with respect to variation in doping concentration of the metal material in the second functional layer.

Accordingly, the organic EL element pertaining to the present aspect suppresses variation in properties of the organic EL element and has the second functional layer that includes an alkali metal or alkaline earth metal.

BRIEF DESCRIPTION OF THE DRAWINGS

These and other objects, advantages, and features of the technology pertaining to the present disclosure will become apparent from the following description thereof taken in conjunction with the accompanying drawings, which illustrate at least one specific embodiment of the technology pertaining to the present disclosure.

FIG. 7A shows a TFT substrate. FIG. 7B shows an anode formed on the TFT substrate. FIG. 7C shows a bank layer formed on the anode and the TFT substrate. FIG. 7D shows a hole injection layer formed on the anode in an opening of the bank layer. FIG. 7E shows a hole transport layer formed on the hole injection layer in the opening of the bank layer. FIG. 7F shows a light-emitting layer formed on the hole transport layer in the opening of the bank layer.

FIG. 8A shows an electron transport layer formed on the light-emitting layer and the bank layer. FIG. 8B shows an electron injection layer formed on the electron transport layer. FIG. 8C shows an opposing electrode formed on the electron injection layer. FIG. 8D shows a sealing layer formed on the opposing electrode.

DESCRIPTION OF EMBODIMENTS

The following describes organic EL elements pertaining to embodiments. The following description provides an exemplification for describing configuration, operation, and effects pertaining to one aspect of the present disclosure. Aside from parts essential to the present disclosure, the present disclosure is not limited to the exemplification.

Embodiment 1

[1. Configuration of Organic EL Element]

Figure 1:
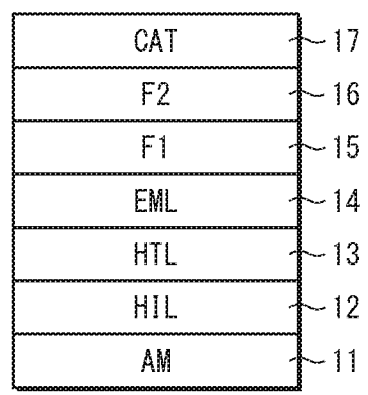
FIG. 1 schematically illustrates a structure of an organic EL element pertaining to Embodiment 1.

FIG. 1 schematically illustrates a cross-section structure of an organic EL element pertaining to the present embodiment. An organic EL element 1 includes an anode 11, a hole injection layer 12, a hole transport layer 13, a light-emitting layer 14, a first functional layer 15, a second functional layer 16, and a cathode 17.

In the organic EL element 1, the anode 11 and the cathode 17 are disposed opposing each other and the light-emitting layer 14 is disposed between the anode 11 and the cathode 17.

The hole transport layer 13 is disposed in contact with the light-emitting layer 14 on the anode 11 side of the light-emitting layer 14. The hole injection layer 12 is disposed between the hole transport layer 13 and the anode 11.

The first functional layer 15 is disposed in contact with the light-emitting layer 14 on the cathode 17 side of the light-emitting layer 14. The second functional layer 16 is disposed between the first functional layer 15 and the cathode 17, in contact with the first functional layer 15.

The anode 11 includes a metal layer composed from a light-reflective metal material. Specific examples of metal materials that are light-reflective include silver (Ag), aluminium (Al), aluminium alloy, molybdenum (Mo), silver palladium copper alloy (APC), silver rubidium gold alloy (ARA), molybdenum chromium alloy (MoCr), molybdenum tungsten alloy (MoW), and nickel chromium alloy (NiCr).

The hole injection layer 12 has a function of promoting injection of holes into the light-emitting layer 14 from the anode 11. The hole injection layer 12 is, for example, composed from an oxide of Ag, Mo, chromium (Cr), vanadium (V), tungsten (W), nickel (Ni), or iridium (Ir), or from an electrically conductive polymer material such as poly(3, 4-ethylenedioxythiophene) polystyrene sulfonate (PEDOT: PSS).

The hole transport layer 13 has a function of transporting holes injected from the hole injection layer 12 to the light-emitting layer 14. For example, polyfluorene or a derivative thereof, or a polymer compound such as polyarylamine or a derivative thereof may be used.

The light-emitting layer 14 sandwiched between and in contact with the hole transport layer 13 and the first functional layer 15 has a function of emitting light by using recombination of holes and electrons. A known organic material may be used as a material to form the light-emitting layer 14. For example, a phosphorescent material may be used, such as an oxinoid compound, perylene compound, coumarin compound, azacoumarin compound, oxazole compound, oxadiazole compound, perinone compound, pyrrolopyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of an 8-hydroxyquinoline compound, metal complex of a 2-bipyridine compound, complex of a Schiff base and a group III metal, metal complex of oxine, fluorescent substance of a rare earth complex or similar, or metal complex emitting phosphorescence such as tris(2-phenylpyridine) iridium.

The first functional layer 15 has a function of limiting injection of electrons to the light-emitting layer 14. This function is implemented by design of the energy band structure, described later. The first functional layer 15 is composed from an organic material that has high electron transport mobility, and does not include an alkali metal or alkaline earth metal. Further, thickness of the first functional layer 15 is greater than 1 nm and less than 150 nm. When the thickness of the first functional layer 15 is excessively thin, electrons can transfer directly from the second functional layer 16 to the light-emitting layer 14 and there is a risk that size of an energy barrier at an interface between the first functional layer 15 and the light-emitting layer 14 may not have sufficient effect on current flowing between the cathode 17 and the light-emitting layer 14. However, when the thickness of the first functional layer 15 is greater than 1 nm, direct transfer of electrons from the second functional layer 16 to the light-emitting layer 14 can be suppressed.

Note that thickening of the first functional layer 15 increases the amount of light absorption at the first functional layer 15. In order to avoid excessively attenuating light transmitted through the first functional layer 15, the thickness of the first functional layer 15 is preferably less than 150 nm.

The second functional layer 16 has a function of transporting electrons supplied from the cathode 17 to the first functional layer 15, towards the light-emitting layer 14. The second functional layer 16 is, for example, formed from an organic material that has high electron transport mobility, doped with a metal selected from alkali metals or alkaline earth metals.

Alkali metals are lithium, sodium, potassium, rubidium, cesium, and francium, and suitable alkaline earth metals are calcium, strontium, barium, and radium.

As the organic material used in the second functional layer 16, for example, a π-electron system low-molecular-weight organic material may be used, such as an oxydiazole derivative (OXD), a triazole derivative (TAZ), or a phenanthroline derivative (BCP, Bphen).

The cathode 17 includes at least one of a metal layer formed from a metal material and a metal oxide layer formed from a metal oxide. Thickness of a metal layer included in the cathode 17 is thin, set from 1 nm to 50 nm, and is light-transmissive. The metal material is light-reflective, but because the thickness of the metal layer is equal to or less than 50 nm, light transmission can be ensured. Accordingly, a portion of light from the light-emitting layer 14 is reflected at the cathode 17 but a remaining portion is transmitted through the cathode 17.

Ag, an Ag alloy mainly composed of Ag, Al, or an Al alloy mainly composed of Al may be used as the metal material that forms the metal layer included in the cathode 17. As an Ag alloy, a magnesium silver alloy (MgAg) or iridium silver alloy may be used. Ag basically has a low resistivity, Ag alloys are preferable in that they have excellent heat and corrosion resistance and can maintain good electrical conductivity over a long period of time. As an Al alloy, a magnesium aluminium alloy (MgAl) or lithium aluminium alloy (LiAl) may be used. As other alloys that may be used, a lithium magnesium alloy or a lithium iridium alloy may be used.

The metal layer included in the cathode 17 may be a simple layer formed from an Ag layer or a MgAg alloy layer, may be a layered structure including an Mg layer and an Ag layer (Mg/Ag), or may be a layered structure including an MgAg alloy layer and an Ag layer (MgAg/Ag).

Further, the cathode 17 may be a simple metal layer or a simple metal oxide layer, or may be a layered structure in which a metal oxide layer composed of a metal oxide such as ITO or IZO is layered on the metal layer.

[2. Energy Band Structure]

The organic EL element 1 is characterized by an energy band structure of the light-emitting layer 14, the first functional layer 15, and the second functional layer 16. The following describes energy levels of organic material forming the layers as energy levels of each layer.

Figure 2:
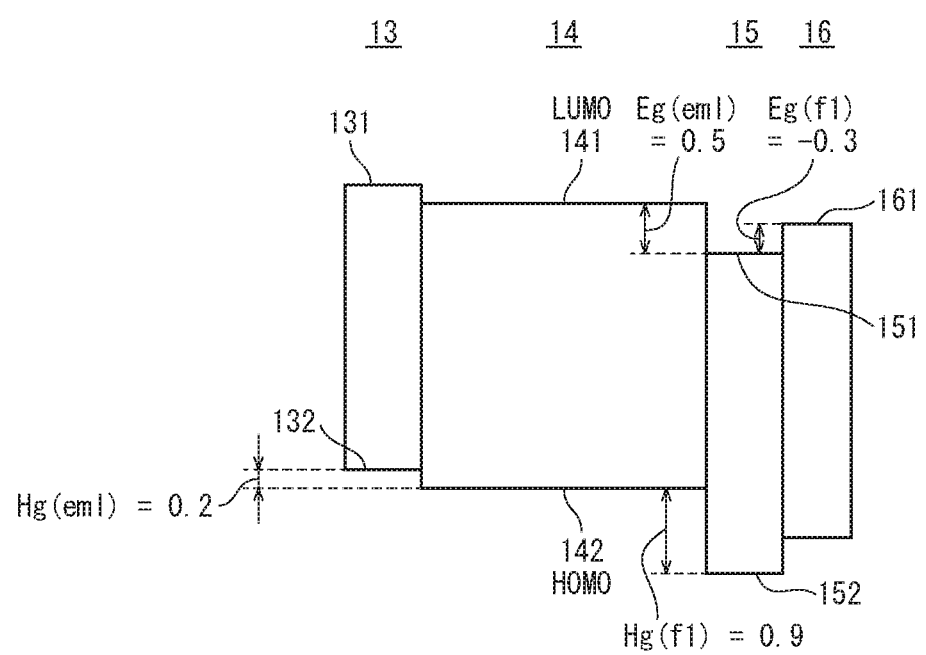
FIG. 2 is a band diagram illustrating an energy band structure of the organic EL element pertaining to Embodiment 1.

FIG. 2 is a band diagram illustrating an energy band structure of the organic EL element 1. In FIG. 2, the LUMO energy level (hereinafter, "LUMO level") and the highest occupied molecular orbital (HOMO) energy level (hereinafter, "HOMO level") of only the hole transport layer 13, the light-emitting layer 14, the first functional layer 15, and the second functional layer 16 are illustrated, and energy levels of other layers are not shown. Further, FIG. 2 does not show electron vacuum level, but the lower the LUMO level in the band diagram, the greater the difference from the electron vacuum level, and the lower the energy level.

[2.1 Energy Barriers]

Energy barriers to injection of electrons from the cathode 17 to the light-emitting layer 14 exist at interfaces between each layer from the cathode 17 to the light-emitting layer 14. These energy barriers are caused by differences in LUMO level at each interface between a layer nearer the anode 11 and a layer nearer the cathode 17. In the following, an energy barrier to injection of electrons from the cathode 17 side to the anode 11 side at an interface between two adjacent layers is referred to as an "electron injection barrier".

In injection of electrons from the cathode 17 to the second functional layer 16, electrons are transferred from the cathode 17 to metal in the second functional layer 16, and electrons are transferred from the metal to the LUMO of organic material of the second functional layer 16. Thus, an electron injection barrier Eg(f2) from the cathode 17 to the second functional layer 16 corresponds to a difference between a LUMO level 161 of the second functional layer 16 and a Fermi level of the metal of the second functional layer. In the present Embodiment, the electron injection barrier Eg(f2) is 0 eV.

An electron injection barrier Eg(f1) from the second functional layer 16 to the first functional layer 15 is defined by a difference between a LUMO level 151 of the first functional layer 15 and a LUMO level 161 of the second functional layer 16. The LUMO level 151 of the first functional layer 15 has a lower energy level than the LUMO level 161 of the second functional layer 16, and the electron injection barrier Eg(f1) satisfies Expression (1), below. In the present embodiment, the electron injection barrier Eg(f1) is −0.3 eV.

$$Eg(f1)<0 \qquad \text{Expression (1)}$$

An electron injection barrier Eg(eml) to injection of electrons from the first functional layer 15 to the light-emitting layer 14 is defined by a difference between a LUMO level 141 of the light-emitting layer 14 and the LUMO level 151 of the first functional layer 15. The electron injection barrier Eg(eml) is the greatest electron injection barrier present at interfaces between layers from the cathode 17 to the light-emitting layer 14. In the present embodiment, the electron injection barrier Eg(eml) is 0.5 eV.

Energy barriers to injection of holes from the anode 11 side to the cathode 17 side exist at interfaces between each layer from the anode 11 to the light-emitting layer 14. These energy barriers are caused by differences in HOMO level at each interface between a layer nearer the anode 11 and a layer nearer the cathode 17. In the following, an energy barrier to injection of holes from the anode 11 side to the cathode 17 side at an interface between two adjacent layers is referred to as a "hole injection barrier".

A hole injection barrier Hg(eml) from the hole transport layer 13 to the light-emitting layer 14 is defined by a difference between a HOMO level 132 of the hole transport layer 13 and a HOMO level 142 of the light-emitting layer 14. In the present embodiment, the hole injection barrier Hg(eml) is 0.2 eV.

The electron injection barrier Eg(eml) and the hole injection barrier Hg(eml) satisfy Expression (2), below. Further, the electron injection barrier Eg(eml) and the hole injection barrier Hg(eml) satisfy Expression (3), below. In the present embodiment, the electron injection barrier Eg(eml) of the organic EL element 1 is 0.3 eV greater than the hole injection barrier Hg(eml).

$$Eg(eml)>Hg(eml) \qquad \text{Expression (2)}$$

$$Eg(eml)-Hg(eml) \geq 0.3 \text{ eV} \qquad \text{Expression (3)}$$

Further, a hole injection barrier Hg(f1) to injection of holes from the light-emitting layer 14 to the first functional layer 15 is defined by a difference between a HOMO level 152 of the first functional layer 15 and the HOMO level 142 of the light-emitting layer 14. In the present embodiment, this is 0.9 eV.

The hole injection barrier Hg(f1) and the hole injection barrier Hg(eml) satisfy Expression (4), below.

$$Hg(f1)>Hg(eml) \qquad \text{Expression (4)}$$

Further, the electron injection barrier Eg(eml) and the hole injection barrier Hg(f1) satisfy Expression (5), below. Further, the electron injection barrier Eg(eml) and the hole injection barrier Hg(f1) satisfy Expression (6), below. In the present embodiment, the hole injection barrier Hg(f1) of the organic EL element 1 is 0.4 eV greater than the electron injection barrier Eg(eml).

$$Eg(eml)<Hg(f1) \qquad \text{Expression (5)}$$

$$Hg(f1)-Eg(eml) \geq 0.4 \text{ eV} \qquad \text{Expression (6)}$$

[3. Experiments]

Figure 3:
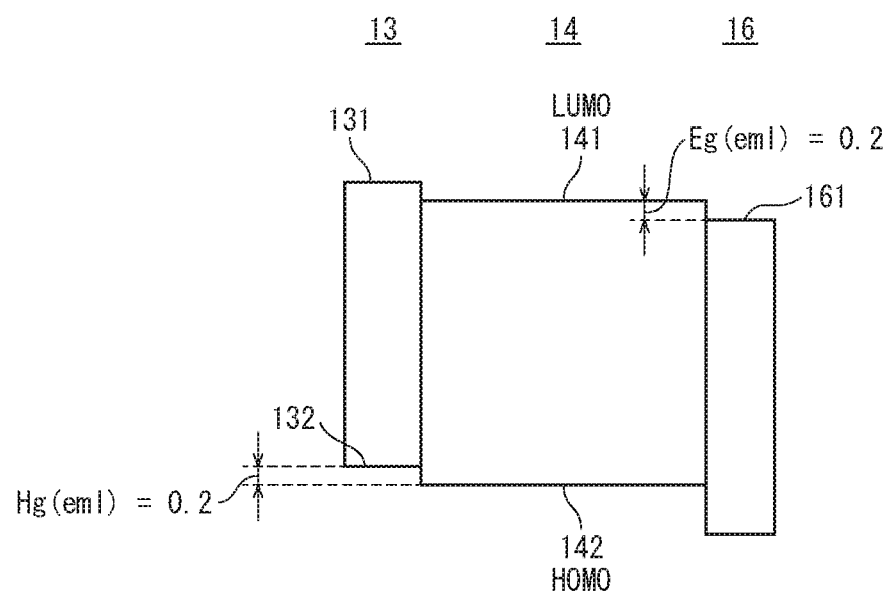
FIG. 3 is a band diagram illustrating an energy band structure of a comparative example.

In order to evaluate influence of doping concentration of the metal in the second functional layer 16 on properties of the organic EL element 1, working examples of the energy band structure illustrated in FIG. 2 and comparative examples of the energy band structure illustrated in FIG. 3 were created as test bodies having various doping concentrations, and light emission efficiency, voltage, and lifespan of each of the test bodies were measured. The measurement of light emission efficiency was performed by using luminescence with respect to a unit amount of current (hereinafter, "current efficiency"). Measurement of lifespans was performed by continuously driving the test bodies to obtain times until luminance decreased by 5% from initial values.

The energy band structure of the working examples was such that, as shown in FIG. 2, Eg(eml) was 0.5 eV and Eg(f1) was −0.3 eV. HOMO level values were measured by using a photoelectron spectrometer (Riken Keiki Co., Ltd., model AC-2). For each of the relevant thin films, a LUMO level value was obtained by subtracting an energy gap of an optical absorption edge of the thin films from the HOMO level value for the thin film. In the working examples, barium (Ba) was used as the metal in the second functional layer 16, and three test bodies were created with doping concentrations of 5 wt %, 10 wt %, and 30 wt %, respectively.

The energy band structure of the comparative examples, illustrated in FIG. 3, is a structure in which the first functional layer 15 is omitted from the energy band structure of the working examples, illustrated in FIG. 2, so Eg(eml) is 0.2 eV. The hole transport layer 13, the light-emitting layer 14, and the second functional layer 16 were made from the same materials to have the same structure for both the comparative examples and the working examples. In the comparative examples, Ba was used as the metal in the second functional layer 16, and three test bodies were created with doping concentrations of 5 wt %, 20 wt %, and 40 wt %, respectively.

Figure 4A:
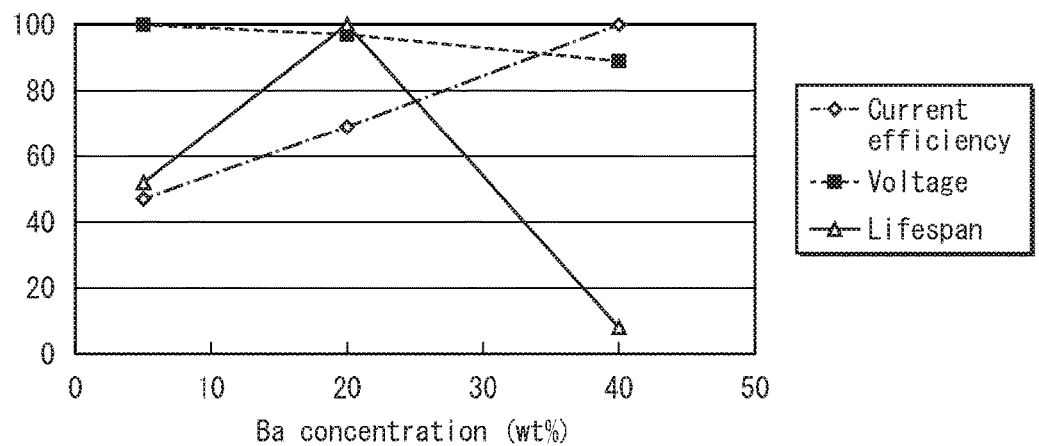
FIG. 4A includes a graph showing property changes corresponding to barium concentration in comparative examples, and FIG. 4B includes a graph showing property changes corresponding to barium concentration in working examples.
Figure 4B:
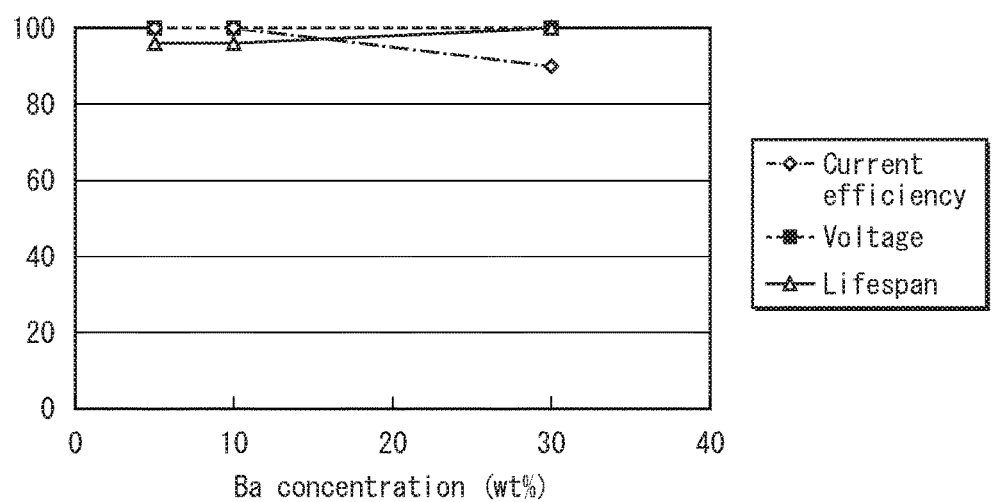

FIG. 4A includes a graph showing measurement results taken using the comparative examples, and FIG. 4B includes a graph showing measurement results taken using the working examples. The horizontal axes indicate Ba doping concentration. On the vertical axes, highest measured values for current efficiency and lifespan are indicated as reference values of 100%, and other measured values are indicated as percentages thereof. Because the lower voltage is, the better, with respect to properties of organic EL elements, the reciprocal of the lowest measured values for voltage are indicated as reference values of 100%, and the reciprocal of other measured values are indicated as percentages thereof.

In the comparative examples, in response to different doping concentrations, current efficiency, voltage, and lifespan all indicated large changes. In the working examples, changes due to different doping concentrations were minor for current efficiency, voltage, and lifespan.

For example, in a plurality of organic EL elements formed on a substrate surface, when a Ba doping concentration of the second functional layer 16 varies in a 5% range from 25 wt %, according to the comparative examples the range of current efficiency would be 3.8%, the range of voltage would be 1.1%, and the range of lifespan would be 12%, all of which are large variations. On the other hand, according to the working examples, when the Ba doping concentration varies in a 5% range from 25 wt %, the range of current efficiency would be 1.2%, the range of voltage would be 0%, and the range of lifespan would be 0.5%, none of which are large variations.

In this way, the current efficiency, voltage, and lifespans of the working examples are less dependent on Ba doping concentration in the second functional layer 16 than in the comparative examples.

From these results, it can be considered that, in the working examples, influence of changes in Ba doping concentration in the second functional layer 16 is suppressed by having the LUMO level 151 of the first functional layer 15 lower than the LUMO level 161 of the second functional layer 16, and by having a value of Eg(eml) large enough to sufficiently suppress injection of electrons to the light-emitting layer 14.

Accordingly, when the electron injection barrier Eg(eml) at the interface between the first functional layer 15 and the light-emitting layer 14 is at least 0.3 eV, a suppression of dependency on Ba doping concentration in the second functional layer 16 can be expected. More preferably, when the electron injection barrier Eg(eml) is at least 0.5 eV, dependency on doping concentration can be sufficiently suppressed.

Note that in the comparative examples, in response to changes in doping concentration, inconsistent changes in current efficiency, reciprocal of voltage, and lifespan were exhibited. Specifically, current efficiency increased steadily along with the increase in doping concentration, to reach a maximum value at the doping concentration of 40 wt %. The reciprocal of voltage was greatest at the doping concentration of 5 wt %, and decreased steadily along with the increase in doping concentration. Lifespan increased along with the increase in doping concentration from 5 wt % to a maximum value at the doping concentration of 20 wt %, and subsequently decreased.

Inconsistency in trends for multiple properties with respect to changes in Ba doping concentration is a factor that increases difficulty of design of organic EL elements.

On the other hand, in the working examples, as indicated in FIG. 4B, almost no changes in the reciprocal of voltage and lifespan were indicated by changes in doping concentration, and current efficiency maintained a value of 90% of maximum even at its lowest value, which corresponded to a doping concentration of 30 wt %. Accordingly, in the working examples, inconsistent trends in changes in current efficiency, reciprocal of voltage, and lifespan in response to changes in doping concentration are minor, making design of organic EL elements simpler.

[4. Summary]

As described above, the organic EL element 1 pertaining to the present embodiment has the LUMO level 151 of the first functional layer 15 that is lower than the LUMO level 161 of the second functional layer 16, and the electron injection barrier Eg(f1) to injecting electrons from the second functional layer 16 to the first functional layer 15 has a negative value. Thus, even if doping concentration of the metal material in the second functional layer 16 varies, it is unlikely that the electron injection barrier Eg(f1) from the second functional layer 16 to the first functional layer 15 would become larger than the electron injection barrier Eg(eml) from the first functional layer 15 to the light-emitting layer 14. As a result, size of the electron injection barrier Eg(eml) from the first functional layer 15 to the light-emitting layer 14 is the dominant influence on properties such as current efficiency, voltage, and lifespan of the organic EL element 1.

This is because, even if doping concentration of the metal in the second functional layer 16 varies, causing variation in the electron injection barrier Eg(f2) and Eg(f1), the amount of current flowing from the cathode 17 towards the light-emitting layer 14 is rate-limited not by the electron injection barrier Eg(f2) and Eg(f1), but by the electron injection barrier Eg(eml), which is greater.

Size of the electron injection barrier Eg(eml) does not change even if doping concentration of the metal material in the second functional layer 16 varies, and therefore current efficiency, voltage, and lifespan properties are also stabilized with respect to variation in doping concentration of the metal material in the second functional layer 16.

Accordingly, the organic EL element 1 pertaining to the present embodiment suppresses variation in properties of the organic EL element 1 while having the second functional layer 16 that includes an alkali metal or alkaline earth metal.

Here, typically, current flow from the cathode 17 towards the light-emitting layer 14 is not only influenced by electron injection barriers, but also by electron transport mobility of each layer from the cathode 17 to the light-emitting layer 14.

However, when the electron injection barrier Eg(eml) is sufficiently large, even if electron transport mobility of the second functional layer 16 or other layers between the cathode 17 and the light-emitting layer 14 vary, influence of the variance of electron transport mobility on current is decreased.

Accordingly, in the organic EL element 1 pertaining to the present embodiment, even if variation occurs in electron transport mobility of the second functional layer 16, variation in current efficiency, voltage, and lifespan is suppressed.

In particular, a difference of at least 0.3 eV between the LUMO level 151 of the first functional layer 15 and the LUMO level 141 of the light-emitting layer 14 is preferable. By satisfying this condition, stability of current efficiency, lifespan, and voltage of the organic EL element 1 can be expected with respect to variation in doping concentration of metal material in the second functional layer 16.

Further, the metal material included in the second functional layer is Ba, and therefore high electron injectability from the cathode 17 to the second functional layer 16 can be expected.

Further, the thickness of the first functional layer 15 is greater than 1 nm and less than 150 nm, thereby suppressing direct transfer of electrons from the second functional layer 16 to the light-emitting layer 14 and ensuring that the electron injection barrier Eg(eml) from the first functional layer 15 to the light-emitting layer 14 is the dominant influence on properties such as current efficiency, voltage, and lifespan.

Further, the anode 11 is light-reflective, the cathode 17 is light-transmissive, and therefore the organic EL element 11 has a top-emission structure in which light emitted from the light-emitting layer 14 is emitted from the cathode 17 side of the organic EL element 1. When the top-emission type of the organic EL element 1 is arrayed in a plurality on a surface of a substrate in an organic EL display panel, the second functional layer 16 of a plurality of the organic EL element 1 can be formed at once by creating a uniform thin film on the substrate by co-evaporation of metal material and organic material. The organic EL element 1 pertaining to the present disclosure is particularly suited to this kind of manufacturing method, due to the stabilizing of properties with respect to variation in doping concentration of metal material in the second functional layer 16.

Further, in the organic EL element 1 pertaining to the present embodiment, the difference between the LUMO level 151 of the first functional layer 15 and the LUMO level 141 of the light-emitting layer 14 is 0.5 eV. This difference is the electron injection barrier Eg(eml) from the first functional layer 15 to the light-emitting layer 14. When Eg(eml) is at least 0.5 eV, sufficient stability of current efficiency, lifespan, and voltage of the organic EL element 1 can be expected with respect to variation in doping concentration of metal material in the second functional layer 16.

Embodiment 2

According to Embodiment 2, an organic EL display panel 100 is described in which a plurality of the organic EL element 1 according to Embodiment 1 is arrayed on a substrate.

[1. Configuration of Organic EL Display Panel]

Figure 6:
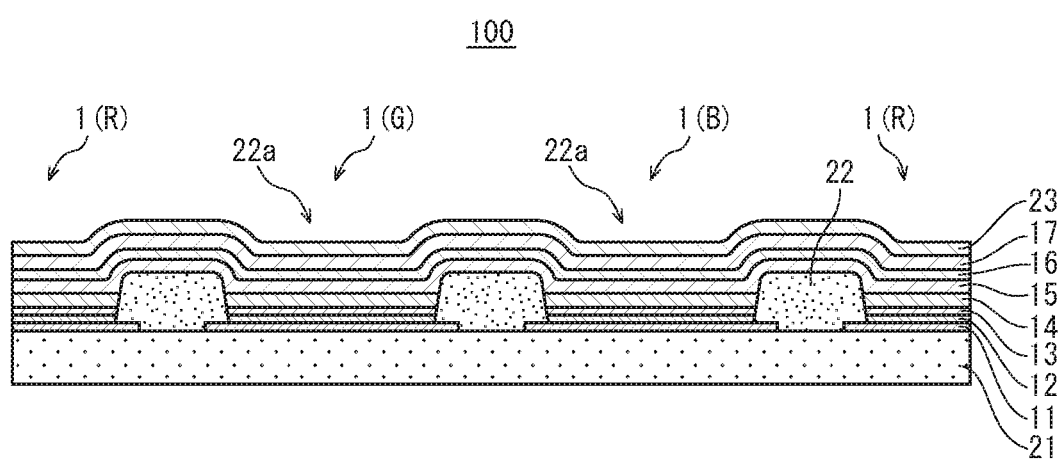
FIG. 6 is a partial cross-section of an organic EL display panel pertaining to Embodiment 2.

FIG. 6 is a partial cross-section of the organic EL display panel 100 (see FIG. 9) pertaining to Embodiment 2. The organic EL display panel 100 has a plurality of pixels, each pixel including the organic EL elements 1(R), 1(G), 1(B), which emit red, green, and blue light respectively. FIG. 6 illustrates a cross-section centered on one of the organic EL elements 1(B), which emits blue light.

In the organic EL display panel 100, each of the organic EL elements 1 are so-called "top-emission" types that emit light in a forwards direction (towards the top of the page in FIG. 6).

The organic EL element 1(R), the organic EL element 1(G), and the organic EL element 1(B) have substantially the same configuration as each other, and therefore the following describes them together as the organic EL element 1.

As illustrated in FIG. 6, the organic EL element 1 includes a TFT substrate 21, the anode 11, a bank layer 22, the hole injection layer 12, the hole transfer layer 13, the light-emitting layer 14, the first functional layer 15, the second functional layer 16, the cathode 17, and a sealing layer 23. The TFT substrate 21, the first functional layer 15, the second functional layer 16, the cathode 17, and the sealing layer 23 are not formed for each pixel, but are common to a plurality of the organic EL elements 1 included in the organic EL display panel 100.

In the following, description is omitted of the configuration of the organic EL element 1 described according to Embodiment 1, and only elements added to the organic EL display panel 100 pertaining to Embodiment 2 are described.

The TFT substrate 21 includes a base material that is insulative, a thin film transistor (TFT) layer, and an interlayer insulating layer. In the TFT layer is a drive circuit for each pixel. The base material is, for example, a substrate made from a glass material. As a glass material, alkali-free glass, soda glass, non-fluorescent glass, phosphate glass, borate glass, or quartz glass may be used. The interlayer insulating layer is made from a resin material, and planarizes a stepped upper surface of the TFT layer. As the resin material, a positive photosensitive material may be used. As the photosensitive material, acrylic resin, polyimide resin, siloxane resin, or phenol resin may be used.

Further, although not shown in FIG. 6, a contact hole is formed for each pixel in the interlayer insulating layer of the TFT substrate 21.

The anode 11 is disposed on the interlayer insulating layer of the TFT substrate 21. The anode 11 is formed for each pixel, and is electrically connected to the TFT layer via the contact hole. The anode 11 may be a simple metal layer, or may be a layered structure in which layers made from a metal oxide such as ITO or IZO are layered on a metal layer.

The bank layer 22 is disposed on the anode 11, leaving a portion of an upper surface of the anode 11 exposed and covering a surrounding region of the anode 11. A region of the upper surface of the anode 11 that is not covered by the bank layer 22 (hereinafter, "opening") corresponds to a sub-pixel. In other words, the bank layer 22 has an opening 22a for each sub-pixel.

The hole injection layer 12, the hole transport layer 13, and the light-emitting layer 14 are layered in this order on the anode 11 within the opening 22a.

According to Embodiment 2, portions of the bank layer 22 that are not disposed on the anode 11 are disposed on the TFT substrate 21. In other words, for the portions of the bank layer 22 not on the anode 11, a bottom surface of the bank layer 22 is in contact with the upper surface of the TFT substrate 21.

The bank layer 22 is made from, for example, an insulative material (for example, acrylic resin, polyimide resin, novolac resin, or phenolic resin). If the light-emitting layer 14 is formed by using a coating application method, the bank layer 22 functions as a structure to prevent applied ink from overflowing, and if the light-emitting layer 14 is formed by using vapor deposition, the bank layer 22 functions as a structure for mounting a vapor deposition mask. According to the present embodiment, the bank layer 22 is made from a resin material that is, for example, a positive photosensitive material. Further, as the photosensitive material, acrylic resin, polyimide resin, siloxane resin, or phenol resin may be used. According to the present embodiment, phenolic resin is used.

On the cathode 17 that is disposed across the sub-pixels is disposed the sealing layer 23, which is intended to suppress degradation of the light-emitting layer 14 due to contact with moisture, oxygen, etc. Because the organic EL display panel 100 is a top-emission type, material of the sealing layer 23 can be selected from a light-transmissive material such as silicon nitride (SiN) or silicon oxynitride (SiON).

Although not shown in FIG. 6, a color filter and upper substrate may be bonded on top of the sealing layer 23 via the sealing resin. By bonding the upper substrate, the hole transport layer 13, the light-emitting layer 14, the first functional layer 15, and the second functional layer 16 can be protected from water, air, etc.

[2. Manufacture of Organic EL Element]

Method of manufacture of the organic EL element 1 is described with reference to FIG. 7A, FIG. 7B, FIG. 7C, FIG. 7D, FIG. 7E, FIG. 7F, FIG. 8A, FIG. 8B, FIG. 8C, and FIG. 8D. FIG. 7A to FIG. 8D show cross-sections schematically illustrating manufacture of the organic EL element 1.

Figure 7A:
FIG. 7A to FIG. 7F are partial cross-sections schematically illustrating a portion of manufacture of an organic EL element pertaining to Embodiment 2.
Figure 7B:
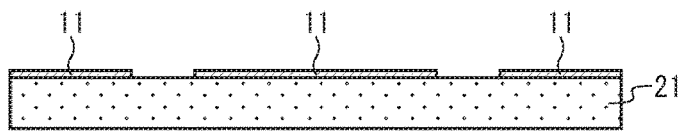

Initially, as shown in FIG. 7A, the TFT substrate 21 is prepared. Subsequently, for each sub-pixel, a thin film of thickness in an inclusive range from 50 nm to 500 nm is formed by vacuum deposition or sputtering of a metal material, forming the anode 11 as shown in FIG. 7B.

Figure 7C:
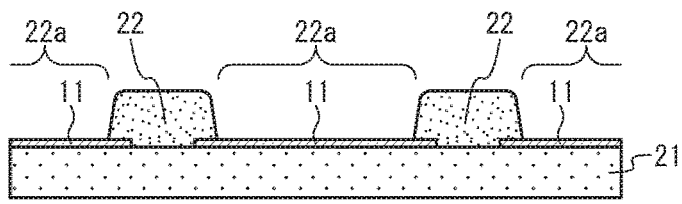

Subsequently, on the anode 11, bank layer resin that is the material of the bank layer 22 is uniformly applied to form a bank material layer. For the bank layer resin, for example, a positive photosensitive material is used such as phenolic resin. Pattern forming in the shape of the bank layer 22 is performed by exposing the bank material layer to light and performing developing, and the bank layer 22 is formed by baking (FIG. 7C). This baking is performed, for example, at a temperature in an inclusive range from 150° C. to 210° C. for 60 minutes. According to the bank layer 22, the opening 22a is defined, which is a region in which the light-emitting layer 14 is formed.

In the process of forming the bank layer 22, surface treatment using an alkaline solution, water, an organic solvent, or similar, and plasma treatment of a surface of the bank layer 22 may be performed. Surface treatment of the bank layer 22 is performed for the purposes of adjusting the contact angle of ink applied to the opening 22a and imparting liquid repellency to a surface of the bank layer 22.

Figure 7D:
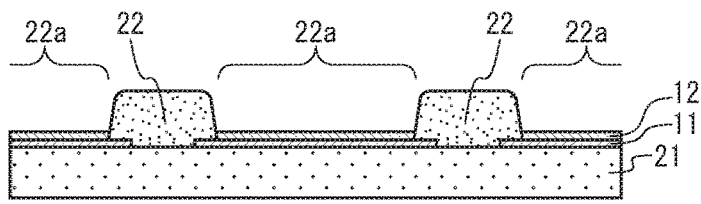

Subsequently, by using mask deposition or application by inkjet, material of the hole injection layer 12 is deposited, and baked to form the hole injection layer 12 as shown in FIG. 7D.

Figure 7E:
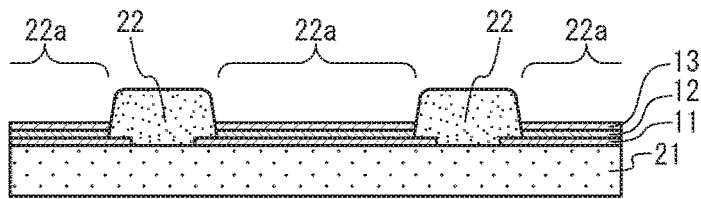

Subsequently, ink including material of the hole transport layer 13 is applied to the opening 22a defined by the bank layer 22, and baked to form the hole transport layer 13 as shown in FIG. 7E.

Figure 7F:
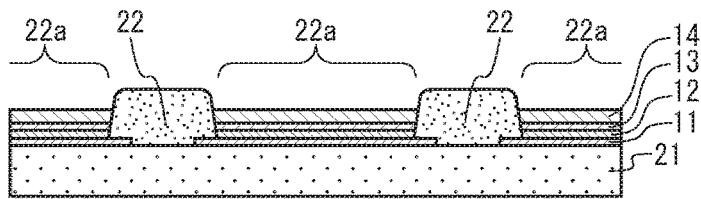

Similarly, ink including material of the light-emitting layer 14 is applied and baked to form the light-emitting layer 14 as shown in FIG. 7F.

Figure 8A:
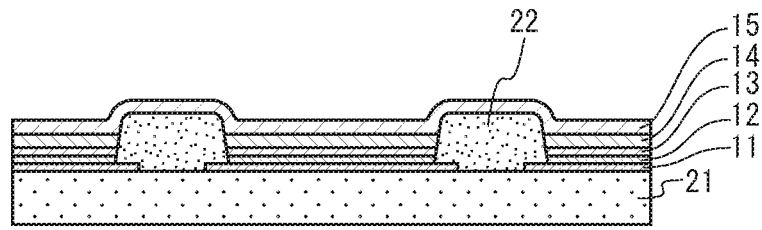
FIG. 8A to FIG. 8D are partial cross-sections schematically illustrating a continuation of the portion of manufacture of the organic EL element in FIG. 7A to FIG. 7F.
Figure 8B:
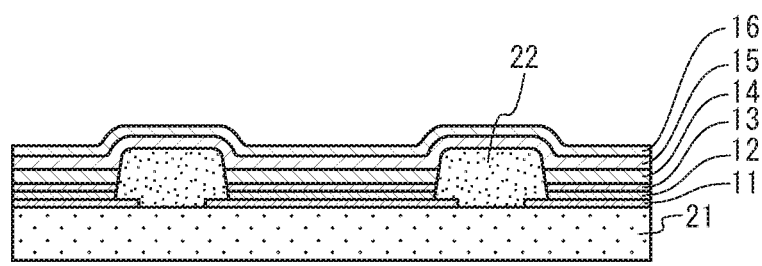

Subsequently, as shown in FIG. 8A, on the light-emitting layer 14, the first functional layer 15 is formed to have a film thickness thicker than 1 nm and thinner than 150 nm by using vacuum deposition or similar of an organic material. The first functional layer 15 is also formed on the bank layer 22. Subsequently, as shown in FIG. 8B, on the first functional layer 15, the second functional layer 16 is formed by using co-evaporation of an organic material and a metal material selected from alkali metals or alkaline earth metals.

Figure 8C:
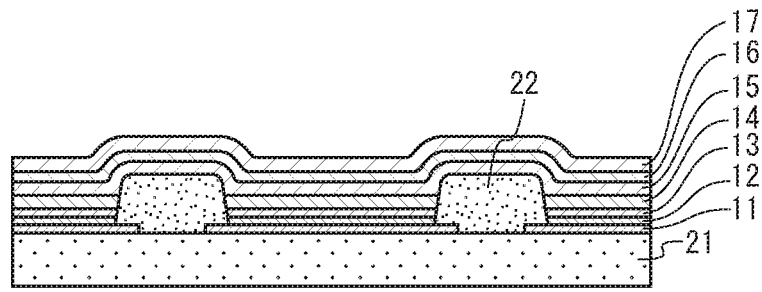

Subsequently, as shown in FIG. 8C, on the second functional layer 16, the cathode 17 is formed by using vacuum deposition, sputtering, or similar, of a metal material to form a thin film.

Figure 8D:
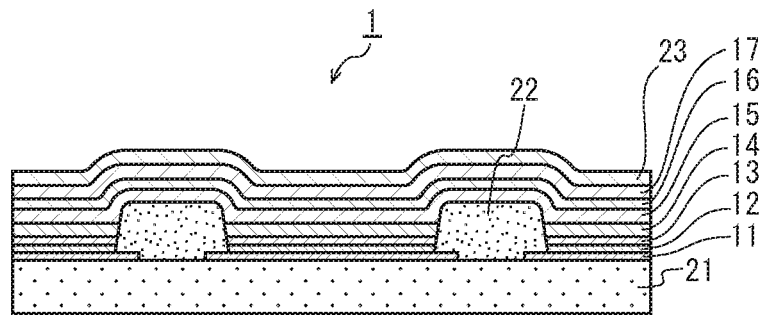

Subsequently, on the cathode 17, the sealing layer 23 is formed by using sputtering, CVD, or similar, on a light-transmissive material such as SiN or SiON to form a thin film as shown in FIG. 8D.

According to the processes described above, the organic EL element 1 is completed, and the organic EL display panel 100 that includes a plurality of the organic EL element 1 is also thereby completed. Note that the color filter and the upper substrate may be bonded onto the sealing layer 23.

[3. Overall Configuration of Organic EL Display Device]

Figure 9:
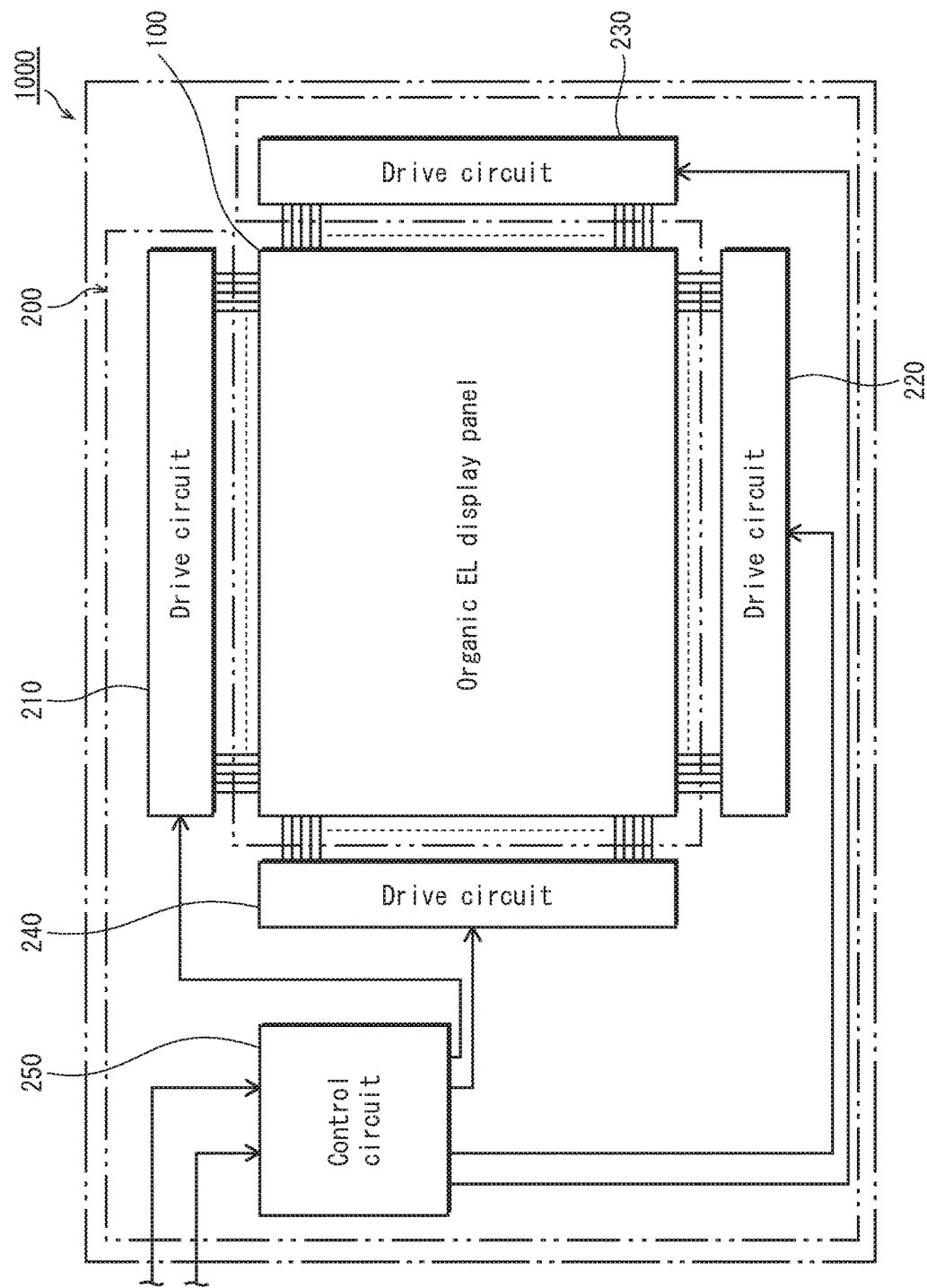
FIG. 9 is a block diagram illustrating an organic EL display device equipped with the organic EL element pertaining to Embodiment 2.

FIG. 9 is a schematic block diagram illustrating a configuration of an organic EL display device 1000. As shown in FIG. 9, the organic EL display device 1000 includes the organic EL display panel 100 and a drive controller 200 connected thereto. The driver controller 200 includes four drive circuits 210, 220, 230, 240 and a control circuit 250.

Note that the organic EL display device 1000 is not limited to the depicted example arrangement of the driver controller 200 relative to the organic EL display panel 100.

<Modifications>

Embodiment 1 and Embodiment 2 are described above, but the present disclosure is not limited to these embodiments. For example, the following modifications can be implemented.

(Modification 1) According to each embodiment, the second functional layer 16 is formed by doping an organic material with a metal selected from alkali metals or alkaline earth metals. However, as long as the second functional layer 16 is formed from a material that realizes the function of improving electron injectability from the cathode 17, the second functional layer 16 need not be formed from a combination of an organic material host material doped with a metal.

For example, the second functional layer 16 may be formed simply from a metal material selected from alkali metals or alkaline earth metals. In such a case, the second functional layer 16 can be formed by using sputtering or similar that uses the metal material as a target material.

Figure 5A:
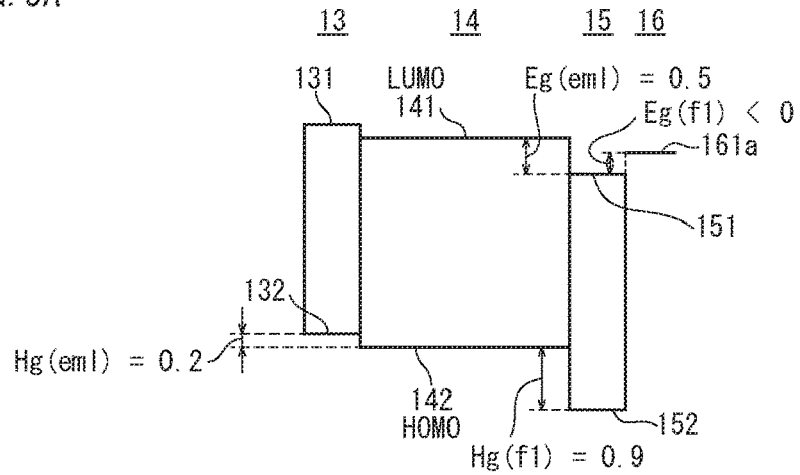
FIG. 5A, FIG. 5B, and FIG. 5C are band diagrams illustrating energy band structures of modifications.

In a case in which the second functional layer 16 is formed simply from a metal material selected from alkali metals or alkaline earth metals, the energy band structure of the organic EL element 1 is designed as in the band diagram illustrated in FIG. 5A. In this energy band structure, the electron injection barrier Eg(f1) from the second functional layer 16 to the first functional layer 15 is defined by a difference between the LUMO level 151 of the first functional layer 15 and a Fermi level 161a of the metal material forming the second functional layer 16. The LUMO level 151 of the first functional layer 15 has a lower energy level than the Fermi level 161a of the metal material forming the second functional layer 16, and therefore Eg(f1) satisfies Expression (1).

Thus, an organic EL element that has the energy band structure shown in FIG. 5A can achieve the same effect as the organic EL element 1 that has the energy band structure shown in FIG. 2 and is described as Embodiment 1.

As another example, the second functional layer 16 may be formed from two or more organic materials, such as a combination of Bathocuproine (BCP), which has high electron transport mobility, and a quinolinol Al complex (Alq), which has high electron injectability from the cathode 17 and high electron transport mobility. In such a case, the second functional layer can be formed by using methods such as co-evaporation of the two or more organic materials.

Even using a method of co-evaporation of the two or more organic materials, as with co-evaporation of a metal material and an organic material, it is difficult to achieve accurate uniformity of deposition proportions of material across a central portion and surrounding portions of the substrate.

However, even if there is variation in deposition proportions of the organic materials in the second functional layer 16 across a plurality of the organic EL element 1 arrayed on a substrate surface, designing the energy band structure so that the electron injection barrier Eg(f1) from the second functional layer 16 to the first functional layer 15 satisfies Expression (1) makes the electron injection barrier Eg(eml) large, and suppresses variation in properties across the plurality of the organic EL element 1.

(Modification 2) The second functional layer 16 according to each embodiment is described as having a single-layer structure, but the second functional layer 16 may have a multi-layer structure.

Figure 5B:
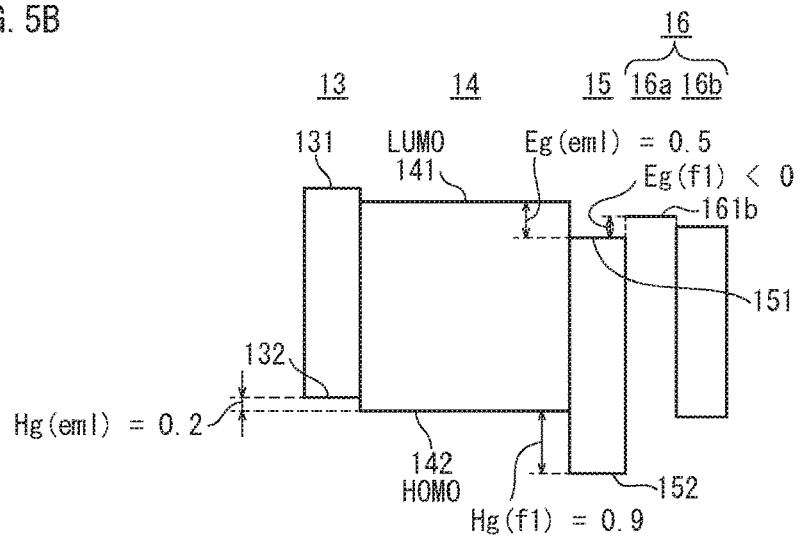

For example, as illustrated in FIG. 5B, the second functional layer 16 may have two layers: a first layer 16a formed from a fluoride of a first metal selected from alkali metals or alkaline earth metals, and a second layer 16b formed from an organic material that has high electron transport mobility that is doped with a metal selected from alkali metals or alkaline earth metals.

The layer formed from the fluoride of an alkali metal or alkaline earth metal works to block impurities. Accordingly, the first layer 16a works to prevent impurities in or on the hole injection layer 12, the hole transport layer 13, the light-emitting layer 14, the first functional layer 15, and the bank layer 22 from penetrating to the second layer 16b or the cathode 17.

As the first metal, in particular, sodium or lithium is preferable, and the first layer 16a is preferably formed from sodium fluoride (NaF) or lithium fluoride (LiF).

When the second functional layer 16 is formed from the first layer 16a and the second layer 16b, the energy band structure of the organic EL element 1 is designed according to the band diagram illustrated in FIG. 5B. In this energy band structure, the electron injection barrier Eg(f1) from the second functional layer 16 to the first functional layer 15 is defined by a difference between the LUMO level 151 of the first functional layer 15 and a Fermi level 161b of the fluoride of the first metal forming the first layer 16a. The LUMO level 151 of the first functional layer 15 has a lower energy level than the Fermi level 161b of the fluoride of the first metal forming the first layer 16a, and therefore Eg(f1) satisfies Expression (1).

Thus, an organic EL element that has the energy band structure shown in FIG. 5B can achieve the same effect as the organic EL element 1 that has the energy band structure shown in FIG. 2, described as Embodiment 1.

Figure 5C:
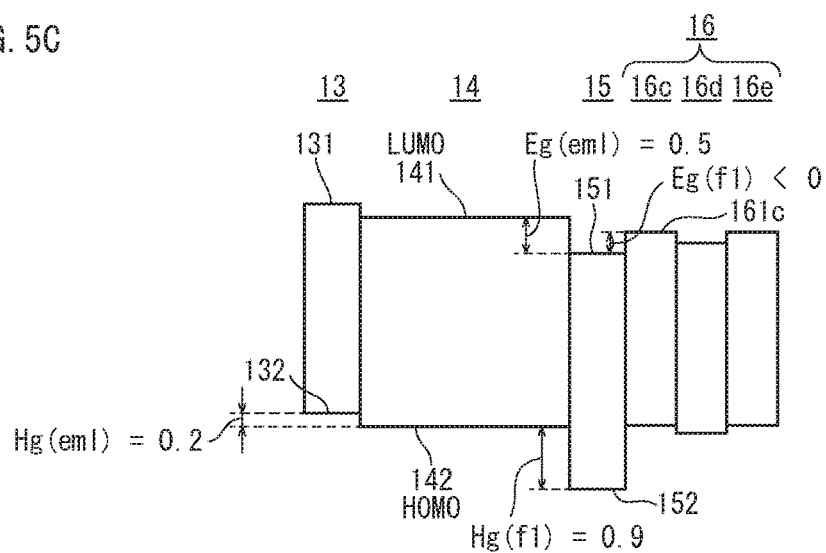

As another modification, for example, as illustrated in FIG. 5C, the second functional layer 16 may include three layers, a first layer 16c, a second layer 16d, and a third layer 16e. At least one of the first layer 16c, the second layer 16d, and the third layer 16e includes a metal material selected from alkali metals or alkaline earth metals.

In this case, the electron injection barrier Eg(f1) from the second functional layer 16 to the first functional layer 15 is defined by the difference between the LUMO level 151 of the first functional layer 15 and a LUMO level of the layer in the second functional layer 16 in direct contact with the first functional layer 15, i.e., a LUMO level 161c of the first layer 16c. The LUMO level 151 of the first functional layer 15 has a lower energy level than the LUMO level 161c of the first layer 16c, and therefore Eg(f1) satisfies Expression (1).

Thus, an organic EL element that has the energy band structure shown in FIG. 5C can achieve the same effect as the organic EL element 1 that has the energy band structure shown in FIG. 2, described as Embodiment 1.

Further, as another example, the second functional layer 16 may include two layers, a first layer formed from Alq, and a second layer that is an Al thin film in direct contact with the first layer.

The Alq of the first layer is reduced by the Al thin film of the second layer, which would normally indicate high electron transport mobility and electron injectability. However, in order that light transmission is not excessively decreased, the second layer of Al is preferably extremely thin.

In forming such an Al thin film, a sputtering method or similar can be used with Al as a target material, but this may cause variation in thickness of the Al thin film on the substrate. Such variation in thickness of the Al thin film on the substrate affects reduction of Alq in the first layer, which can be assumed to cause variation in electron transport mobility and electron injectability of the first layer.

However, even if electron transport mobility and electron injectability of the first layer varies across a plurality of the organic EL element 1 arrayed on the substrate, variation of properties across the plurality of the organic EL element 1 can be suppressed by designing the energy band structure so the electron injection barrier Eg(f1) from the first layer in contact with the first functional layer 15 to the first functional layer 15 satisfies Expression (1), making the electron injection barrier Eg(eml) large.

(Modification 3) The first functional layer 15 according to each embodiment is described as not including an alkali metal or alkaline earth metal. However, the first functional layer 15 may be formed from an organic material doped with a metal selected from alkali metals or alkaline earth metals.

In such a first functional layer 15, when the Fermi level of the metal is higher than the LUMO level of the host organic material, the electron injection barrier Eg(f1) from the second functional layer 16 to the first functional layer 15 is defined by the difference between the Fermi level of the metal included in the first functional layer 15 and the LUMO level of the second functional layer 16. Further, the electron injection barrier Eg(eml) from the first functional layer 15 to the light-emitting layer 14 is defined by the difference between the LUMO level of the light-emitting layer 14 and the Fermi level of the metal included in the first functional layer 15.

In this modification, designing the energy band structure so that the electron injection barrier Eg(f1) satisfies Expression (1) makes the electron injection barrier Eg(eml) large, and suppresses variation in properties across a plurality of the organic EL element 1.

(Modification 4) The organic EL element 1 of each embodiment is provided with the hole injection layer 12, but the organic EL element can be implemented without this layer.

(Modification 5) Regarding conditions for ranges of film thickness for the embodiments above, an entirety of a sub-pixel region defined by the opening 22a need not satisfy the conditions, as long as a portion of each sub-pixel satisfies the conditions for film thickness described above. For example, it suffices that film thickness at a central portion of a sub-pixel satisfies the conditions for film thickness described above.

(Modification 6) According to Embodiment 2, the base material of the organic EL element 1 is described as having glass as an insulative material, but this is just an example. As the insulative material for the base material, resin or ceramics may be used, for example. As a ceramic for the base material, alumina may be used, for example. As a resin for the base material, an insulative material such as polyimide resin, acrylic resin, styrene resin, polycarbonate resin, epoxy resin, polyethersulfone, polyethylene, polyester, or silicone resin may be used. When resin is used for the base material, the resin may be flexible, but this is usually associated with high permeability to oxygen and moisture, which may be assumed to easily lead to deterioration of metal material caused by oxygen and moisture. The organic EL panel 100 pertaining to the present disclosure is particularly suited to manufacturing using a flexible resin, due to the stabilizing of properties with respect to variation in doping concentration of metal material in the second functional layer 16.

(Modification 7) According to each embodiment, a top-emission structure is described in which the anode 11 is light-reflective and the cathode 17 is light-transmissive. However, a bottom-emission structure may be implemented in which the anode 11 is light-transmissive and the cathode 17 is light-reflective.

(Modification 8) According to the embodiments, the hole transport layer 13 and the light-emitting layer 14 are manufactured by using ink coating, but this is just an example. For example, at least one of the hole transport layer 13 and the light-emitting layer 14 may be manufactured by using vapor deposition.

The organic EL element pertaining to the present disclosure is useful in various display devices such as televisions, displays for portable electronic devices, and illuminations, for home, public, or business use.

Although the technology pertaining to the present disclosure has been fully described by way of examples with reference to the accompanying drawings, it is to be noted that various changes and modifications will be apparent to those skilled in the art. Therefore, unless such changes and modifications depart from the scope of the present disclosure, they should be construed as being included therein.

What is claimed is:

1. An organic electroluminescence (EL) element comprising:
    an anode;
    a light-emitting layer disposed above the anode;
    a first functional layer disposed on and in contact with the light-emitting layer;
    a second functional layer disposed on and in contact with the first functional layer; and
    a cathode disposed above the second functional layer, wherein
    the second functional layer includes organic material having electron transport mobility and is configured to transport electrons from the cathode, and
    a lowest unoccupied molecular orbital (LUMO) level of the first functional layer is lower than at least one of a LUMO level of the second functional layer and a Fermi level of a metal material included in the second functional layer,
    wherein the first functional layer is configured to have a negative value for an energy barrier for injection of electrons from the second functional layer to the first functional layer, such that an electron injection barrier from the second functional layer to the first functional layer is smaller than an electron injection barrier from the first functional layer to the light-emitting layer.

2. The organic EL element of claim 1, wherein the LUMO level of the first functional layer is at least 0.3 eV lower than at least one of the LUMO level of the second functional layer and the Fermi level of the metal material included in the second functional layer.

3. The organic EL element of claim 1, wherein a difference between the LUMO level of the first functional layer and a LUMO level of the light-emitting layer is at least 0.3 eV.

4. The organic EL element of claim 1, wherein the metal material is an alkali metal or an alkaline earth metal.

5. The organic EL element of claim 1, wherein the metal material is barium.

6. The organic EL element of claim 1, wherein thickness of the first functional layer is greater than 1 nm and less than 150 nm.

7. The organic EL element of claim 1, wherein the anode is light-reflective, the cathode is light-transmissive, and
    light emitted from the light-emitting layer is emitted from the cathode side of the organic EL element.

8. An organic EL display panel in which the organic EL element of claim 1 is mounted in a plurality on a surface of a substrate.

9. An organic EL display panel in which the organic EL element of claim 1 is mounted in a plurality above a flexible substrate.

10. The organic EL element of claim 1, wherein a metal layer included in the cathode has a thickness of less than or equal to 50 nm.

11. The organic EL element of claim 1, wherein a difference between the LUMO level of the second functional layer and the Fermi level of the metal material included in the second functional layer is 0 eV.

12. An organic electroluminescence (EL) element comprising:
    an anode;
    a light-emitting layer disposed above the anode;
    a first functional layer disposed on and in direct contact with the light-emitting layer;
    a second functional layer disposed on and in contact with the first functional layer; and
    a cathode disposed above the second functional layer, wherein the first functional layer includes a first metal material that is an alkali metal or an alkaline earth metal, and a Fermi level of the first metal material included in the first functional layer is lower than at least one of a LUMO level of the second functional layer and a Fermi level of a second metal material included in the second functional layer, wherein the first functional layer is configured to have a negative value for an energy barrier for injection of electrons from the second functional layer to the first functional layer, such that an electron injection barrier from the second functional layer to the first functional layer is smaller than an electron injection barrier from the first functional layer to the light-emitting layer.

13. The organic EL element of claim 12, wherein
the Fermi level of the first metal material included in the first functional layer is at least 0.3 eV lower than at least one of the LUMO level of the second functional layer and the Fermi level of the second metal material included in the second functional layer.

14. The organic EL element of claim 12, wherein
a difference between the Fermi level of the first metal material included in the first functional layer and a LUMO level of the light-emitting layer is at least 0.3 eV.

15. The organic EL element of claim 12, wherein
the second metal material is an alkali metal or an alkaline earth metal.

16. The organic EL element of claim 12, wherein
the second metal material is barium.

17. The organic EL element of claim 12, wherein
thickness of the first functional layer is greater than 1 nm and less than 150 nm.

18. The organic EL element of claim 12, wherein
the anode is light-reflective, the cathode is light-transmissive, and
light emitted from the light-emitting layer is emitted from the cathode side of the organic EL element.

19. An organic electroluminescence (EL) element comprising:
an anode;
a light-emitting layer disposed above the anode;
a first functional layer disposed on and in contact with the light-emitting layer;
a second functional layer disposed on and in contact with the first functional layer; and
a cathode disposed above the second functional layer, wherein
the second functional layer includes organic material having electron transport mobility and is configured to transport electrons from the cathode, and
a difference between a lowest unoccupied molecular orbital (LUMO) level of the light-emitting layer and a LUMO level of the first functional layer is at least 0.5 eV,
wherein the first functional layer is configured to have a negative value for an energy barrier for injection of electrons from the second functional layer to the first functional layer, such that an electron injection barrier from the second functional layer to the first functional layer is smaller than an electron injection barrier from the first functional layer to the light-emitting layer.

20. The organic EL element of claim 19, wherein
the second functional layer includes a metal material that is an alkali metal or an alkaline earth metal.

21. The organic EL element of claim 20, wherein
the metal material is barium.

22. The organic EL element of claim 19, wherein
thickness of the first functional layer is greater than 1 nm and less than 150 nm.

23. The organic EL element of claim 19, wherein
the anode is light-reflective, the cathode is light-transmissive, and
light emitted from the light-emitting layer is emitted from the cathode side of the organic EL element.

24. An organic electroluminescence (EL) element comprising:
an anode;
a light-emitting layer disposed above the anode;
a first functional layer disposed on and in direct contact with the light-emitting layer;
a second functional layer disposed on and in contact with the first functional layer; and
a cathode disposed above the second functional layer, wherein
the first functional layer includes a first metal material that is an alkali metal or an alkaline earth metal, and
a difference between a lowest unoccupied molecular orbital (LUMO) level of the light-emitting layer and a Fermi level of the first metal material included in the first functional layer is at least 0.5 eV,
wherein the first functional layer is configured to have a negative value for an energy barrier for injection of electrons from the second functional layer to the first functional layer, such that an electron injection barrier from the second functional layer to the first functional layer is smaller than an electron injection barrier from the first functional layer to the light-emitting layer.

25. The organic EL element of claim 24, wherein
the second functional layer includes a second metal material that is an alkali metal or an alkaline earth metal.

26. The organic EL element of claim 25, wherein
the second metal material is barium.

27. The organic EL element of claim 24, wherein
thickness of the first functional layer is greater than 1 nm and less than 150 nm.

28. The organic EL element of claim 24, wherein
the anode is light-reflective, the cathode is light-transmissive, and
light emitted from the light-emitting layer is emitted from the cathode side of the organic EL element.

* * * * *